(12) United States Patent
Bejugam et al.

(10) Patent No.: US 12,354,931 B2
(45) Date of Patent: Jul. 8, 2025

(54) OPTIMIZATION FOR RASTER SCANNING

(71) Applicant: Intel Corporation, Santa Clara, CA (US)

(72) Inventors: Vinith Bejugam, Chandler, AZ (US); Kristof Darmawikarta, Chandler, AZ (US); Yonggang Li, Chandler, AZ (US); Samuel George, Chandler, AZ (US); Srinivas Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 470 days.

(21) Appl. No.: 17/738,085

(22) Filed: May 6, 2022

(65) Prior Publication Data

US 2023/0361002 A1 Nov. 9, 2023

(51) Int. Cl.
*H01L 23/48* (2006.01)
*H01L 21/48* (2006.01)
*H01L 21/68* (2006.01)
*H01L 23/15* (2006.01)

(52) U.S. Cl.
CPC .......... *H01L 23/481* (2013.01); *H01L 21/486* (2013.01); *H01L 21/68* (2013.01); *H01L 23/15* (2013.01)

(58) Field of Classification Search
CPC ....... H01L 21/486; H01L 21/68; H01L 23/15; H01L 23/481; H01L 23/49827; H01L 2224/11005
USPC ........................................................ 257/797
See application file for complete search history.

(56) References Cited

U.S. PATENT DOCUMENTS

2007/0242440 A1\* 10/2007 Sugaya ............... H01L 23/3128
    29/832
2011/0147055 A1\* 6/2011 Ma .................... H01L 23/49822
    29/830

\* cited by examiner

*Primary Examiner* — Jasmine J Clark
(74) *Attorney, Agent, or Firm* — Viering, Jentschura & Partner mbB (57) ABSTRACT

The present disclosure is directed to semiconductor dies and methods that provide a glass substrate, a pulsed laser tool to produce a line-shaped modification to the glass substrate for forming a plurality of structures in the glass substrate. The pulse laser tool may be provided with a predetermined pattern for its movement. The predetermined pattern moves the pulsed laser tool in a series of single steps in a first axial direction and in a series of plural lateral steps in a second axial direction that is perpendicular to the first axial direction, in particular, the single step is followed by the plural lateral steps in a repeating sequence. The series of plural lateral steps form an assembly of line-shaped modifications in parallel rows on the glass substrate, and thereafter the plurality of structures may be formed from the parallel rows of line-shaped modifications in the glass substrate.

19 Claims, 7 Drawing Sheets

OPTIMIZATION FOR RASTER SCANNING

BACKGROUND

Glass is a commonly used substrate for manufacturing semiconductors. It is a low-cost material with excellent properties, such as high thermal resistance, chemical resistance, high flatness, low coefficient of thermal expansion, etc. In addition, glass substrates have high smoothness and shape stability and contribute to the prevention of yield degradation due to defects in sealing or processing defects during dicing and cutting. However, glass is an amorphous material and cannot be easily etched anisotropically. The use of a mechanical drilling process may result in micro-cracks and thermally induced stress when forming vias in a glass substrate. These concerns may be avoided by the use of laser-assisted etching (LAE). LAE is a two-step process that, in the first step, uses a pulsed laser to form or induce line-shaped modifications in a thin glass substrate that may reach from one side to the other, depending on the energy applied. Thereafter, in a second step, the line-shaped modifications may be preferentially etched using conventional wet etch techniques to form through-hole vias and other structures.

At present, one of the key technologies in the 3D assembly of semiconductor chips is the manufacturing of through-hole vias (THVs), particularly through-glass vias (TGVs), which are electrical connections that run vertically through silicon and glass substrates to interconnect devices on the chips. However, the present through-put/run rates for forming TGVs are low. There are several reasons, including, for example, Bessel beams, which are a type of laser beam that is commonly used for LAE, may be difficult to steer with fast scan optics, such as a galvo scanner, an acousto-optical deflector (AOD) scanner and/or a polygon scanner. The run rate may be improved using a pulsed laser tool performing raster scanning along with placing the glass substrate on a moveable stage, but this combination may also lead to other difficulties, such as movement synchronization and stability issues. Accordingly, the formation of THVs and TGVs may benefit from additional techniques and product designs for obtaining improved throughput during the manufacture of semiconductor dies.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is generally directed to an alignment method that provides a tool used for forming voids in an object, for which the tool is moved following a predetermined pattern. The predetermined pattern includes moving the tool in a series of single steps in a first axial direction and in a series of plural lateral steps in a second axial direction that is perpendicular to the first axial direction, for which the single step is followed by the plural lateral steps in a repeating sequence. The tool is activated after each of the plural lateral steps and the single step and plural lateral steps movements of the tool are repeated until the predetermined pattern is completed, and the series of plural lateral steps form an assembly of voids in parallel rows on the object.

In an aspect, the present disclosure is directed to a semiconductor die having a substrate with a glass core and a plurality of vias formed in the glass core, wherein the plurality of vias are positioned in a predetermined pattern to form a layout with substantially parallel rows in a top surface of the glass core. There are interconnect layers formed on the top surface and at a bottom surface of the glass core.

In another aspect, the present disclosure is directed to a method that includes providing a glass substrate, having a pulsed laser tool used to produce a line-shaped modification to the glass substrate for forming a plurality of structures in the glass substrate. The pulse laser tool may be provided with a predetermined pattern for its movement. The predetermined pattern moves the pulsed laser tool in a series of single steps in a first axial direction and in a series of plural lateral steps in a second axial direction that is perpendicular to the first axial direction; in particular, the single step is followed by the plural lateral steps in a repeating sequence. The pulsed laser tool is activated after each of the plural lateral steps and the repeating sequence of the single step and plural lateral steps movements of the pulsed laser tool continues until the predetermined pattern is completed. The series of plural lateral steps form an assembly of line-shaped modifications in parallel rows on the glass substrate, and thereafter the plurality of structures, including through glass vias (TGVs) and cavities, may be formed from the parallel rows of line-shaped modifications in the glass substrate.

In addition, the present disclosure provides an improved run rate for providing glass cores/substrates with vias using laser-assisted etching (LAE). A raster scan may be used by the laser tools forming the through-holes or blind vias in the glass core by generating microfluidic patterns directly on the glass. However, the LAE run rate for forming the vias in the glass core/substrate may be limited by layout designs that place vias in a non-collinear pattern. In an aspect, the present disclosure provides a simple design rule that positions the through-hole vias (THVs) in a collinear pattern, i.e., parallel rows, which leads to improvements in takt time, i.e., the rate at which you need to complete a product to meet customer demand, and yet preserving the random pattern characteristic in die layout design. In a further aspect, the through-holes may also be placed in vertical columns.

In addition, it may be possible, for example, to have the run rate be directly proportional to the number of horizontal rows and/or vertical columns. As the via density per unit area increases, it may become increasingly important that the vias be placed collinear in the x-directions and/or y-direction to produce shorter takt times.

The technical advantages of the present disclosure include providing for economies-of-scale for TGV creation on glass substrates/cores, a potential 50× improvement in takt time, avoiding the costs incurred by galvo or multiple laser heads, and generally designing for manufacturability To more readily understand and put into practical effect, the present alignment methods, and semiconductor dies resulting therefrom, which may be used for forming THVs and TGVs, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

Figure 1:
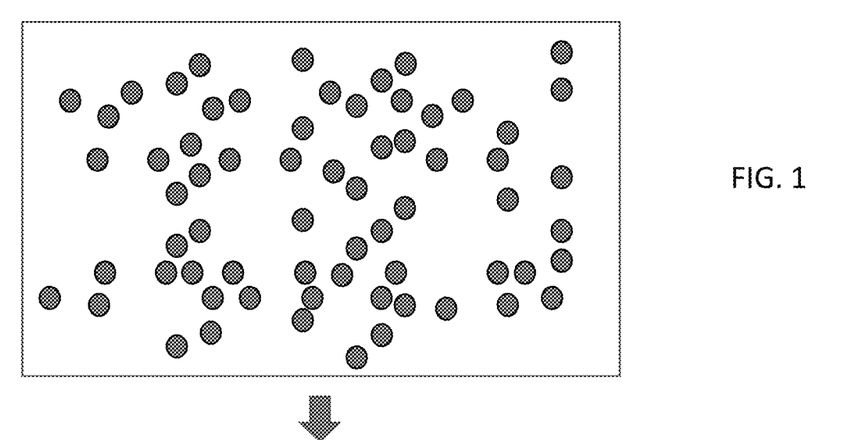
FIG. 1 shows a representation of a conventional product pattern for through-hole vias.

FIG. 1 shows a representation of a conventional product pattern for through-hole vias, which will typically use a product pattern having non-collinear points. For example, as shown in FIG. 1, there are over 50 scan lines are needed to perform a raster scan using a laser tool.

Figure 2:
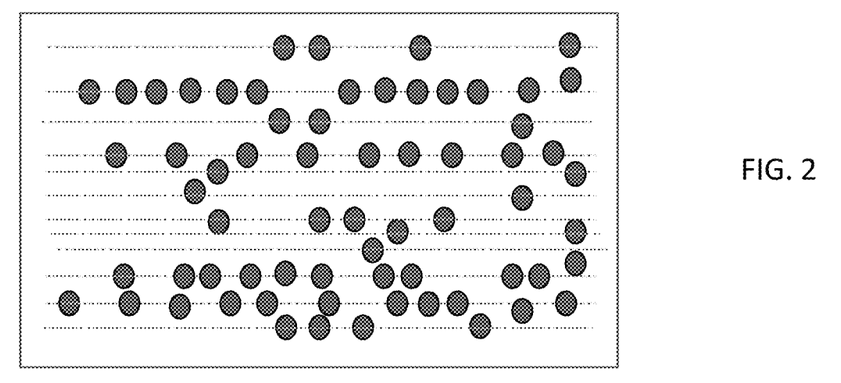
FIG. 2 shows a representation of a converted product pattern for the product from FIG. 1, according to an aspect of the present disclosure.

In FIG. 2, the conventional product from FIG. 1 was converted to a collinear product pattern according to an aspect of the present disclosure. In this aspect, a "minimum" design rule implementation is used to have vias be in a collinear orientation, which in this aspect is only in the x-direction. As a result, only 12 horizontal lines are required for a raster scan, with a consequential reduction in the takt time.

FIGS. 3A, 3B, 3C, and 3D show illustrative views of a semiconductor die 300 including a patterned glass core 301 according to an aspect of the present disclosure. In an aspect, the minimum or collinear design rule may preserve a "randomness" pattern characteristic in a design layout. It should be understood that the present disclosure may be applied to glass cores, as well as organic cores, silicon substrates, and interposers.

Figure 3A:
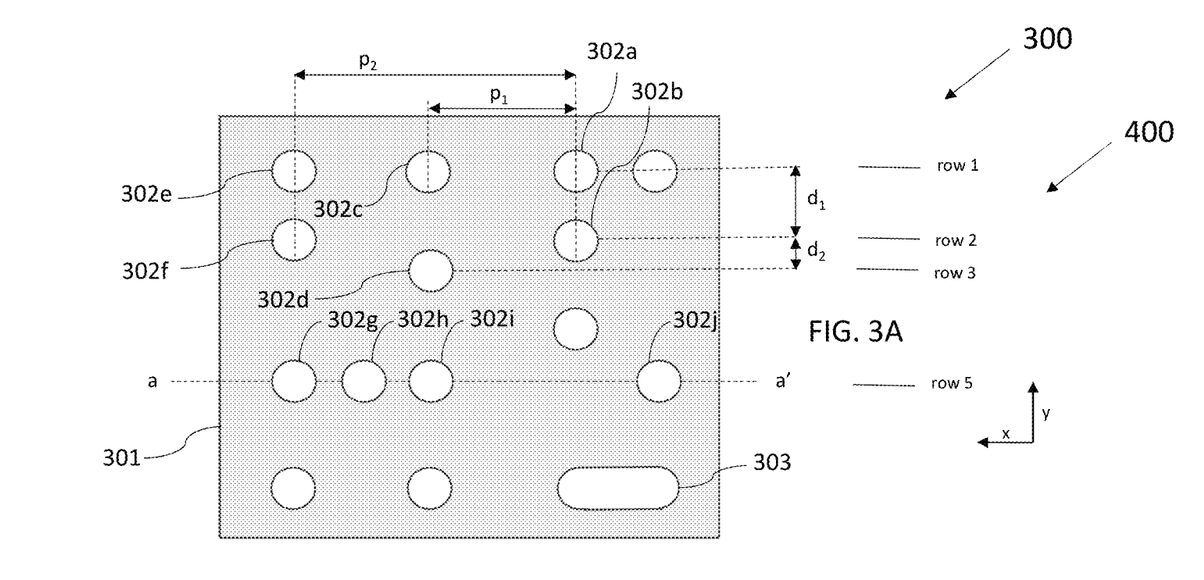
FIGS. 3A, 3B, 3C, and 3D show illustrative views of a patterned glass core, according to an aspect of the present disclosure.

In FIG. 3A, for example, a TGV 302a in row 1 is a vertical distance $d_1$ from a TGV 302b in row 2, whereas the vertical distance below TGV 302b in row 2 and TGV 302d in row 3 is a smaller $d_2$. The pitch between the TGV 302a and TGV 302c in row 1 is $p_1$, while the pitch between TGV 302b and TGV 302f in row 2 is $p_2$, which is larger than $p_1$. Also, in another aspect, the TGV 302a and TGV 302b may be vertically aligned, as well as the TGV 302e and TGV 302f being vertically aligned. A cavity 303 may also be formed in the patterned glass core 301 from two or more blind vias and may be horizontally aligned on a row of TGVs.

Figure 3B:
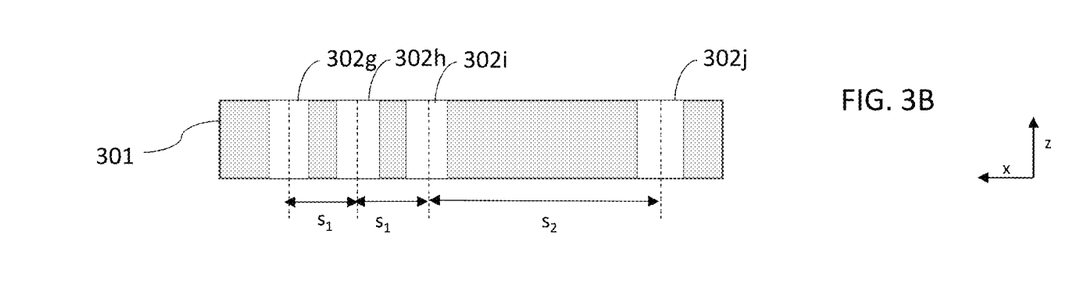

In FIG. 3B, a cross-section view along the a-a' line of FIG. 3A is shown having TGVs 302g, 302h, 302i, and 302j aligned in row 5. The pitch $s_1$ between TGVs 302g and 302h and TGVs 302h and 302i are the same, while the pitch s2 between TGVs 302i and 302j is larger. In the presented design, the vias have multiple pitches but they are collinear, which leads to a decrease in the horizontal and vertical lines needed for raster scanning and improves the rate of the raster scanning. Hence, the tool movement for the single steps and the lateral steps in the predetermined pattern may be the same or variable distance.

As shown in FIG. 3 C, the raster scanning is a sinusoidal/ rectangular pattern 304 that a pulsed laser tool 305 will travel over the top surface of the glass core 301 when forming the line-shaped modifications in the glass core 301. It does this by scanning one scan line at a time, from top to bottom, and then back to the top to start over for a raster scan for the next glass core.

Figure 3C:
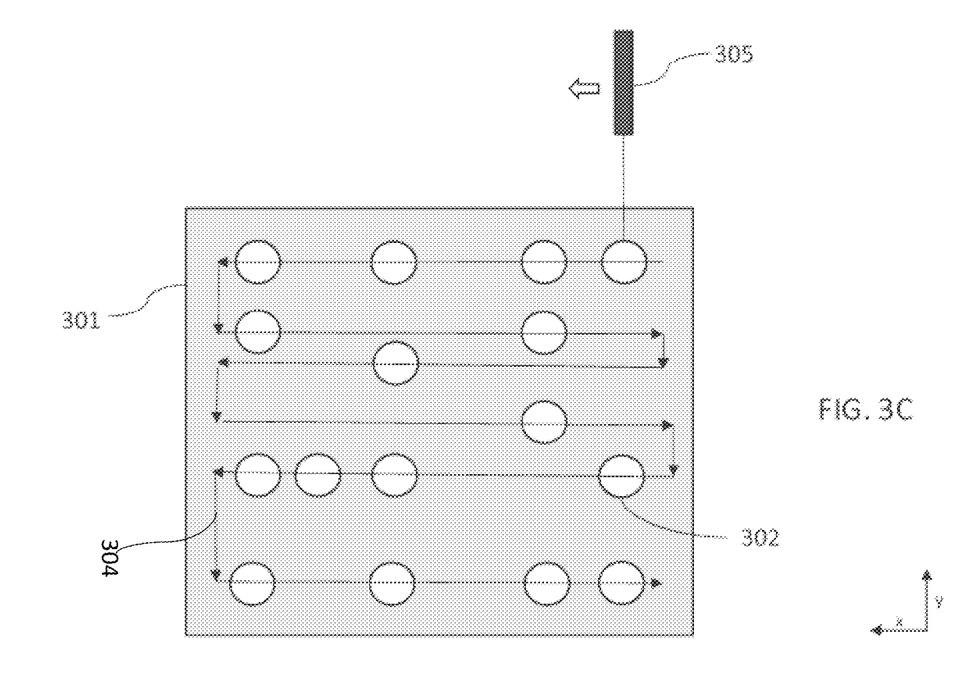

In an aspect, the pattern glass core 301 may be formed by moving the pulsed laser tool in a series of single steps in a first axial direction and in a series of plural lateral steps in a second axial direction that is perpendicular to the first axial direction, for which the single step is followed by the plural lateral steps in a repeating sequence, activating the pulsed laser tool after each of the plural lateral steps, and repeating the single step and plural lateral steps movements of the pulsed laser tool until the pattern is completed.

Figure 3D:
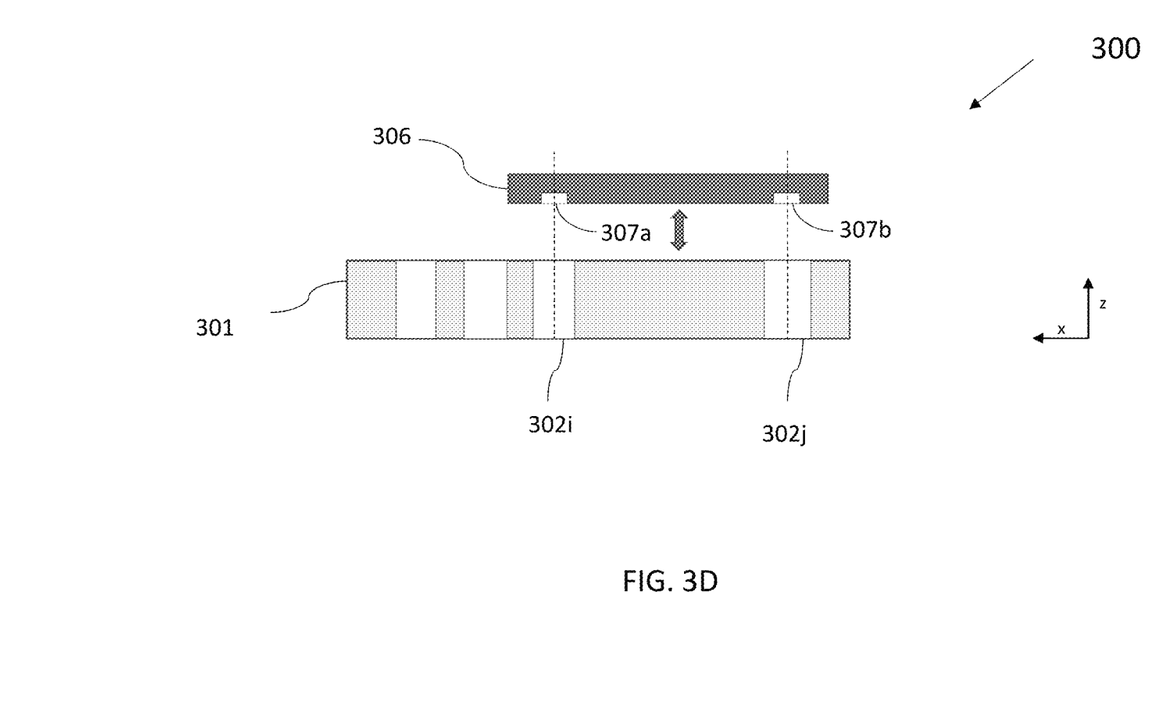

In FIG. 3D, a representative semiconductor device 306 is shown positioned over and separated from the glass core 301. In this aspect, the design rules for a layout for semiconductor device 306 may seek to position its contacts 307a and 307b in a vertical alignment over the TGVs 302i and 302j of the glass core 301. More generally, the semiconductor die 300 may have semiconductor devices in a layout, at each of its levels, that reduces the sign paths to the plurality of vias in the glass core by maximizing the number of vertical alignments of the semiconductor devices with those vias.

It is understood that a design rules set specifies certain geometric and connectivity restrictions to ensure sufficient margins to account for variability in semiconductor manufacturing processes, so as to ensure that most of the parts work correctly. Also, design rules are specific to a particular semiconductor manufacturing process, which, in this case, includes raster scanning.

Figure 4:
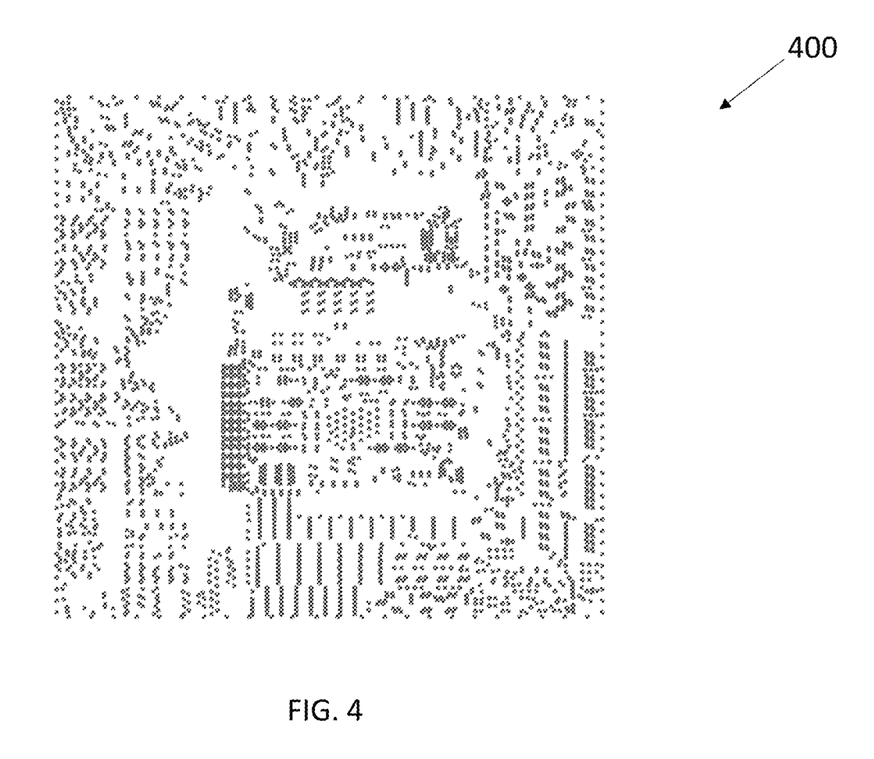
FIG. 4 shows a layout view of a commercial semiconductor die with a conventional product pattern.
Figure 5:
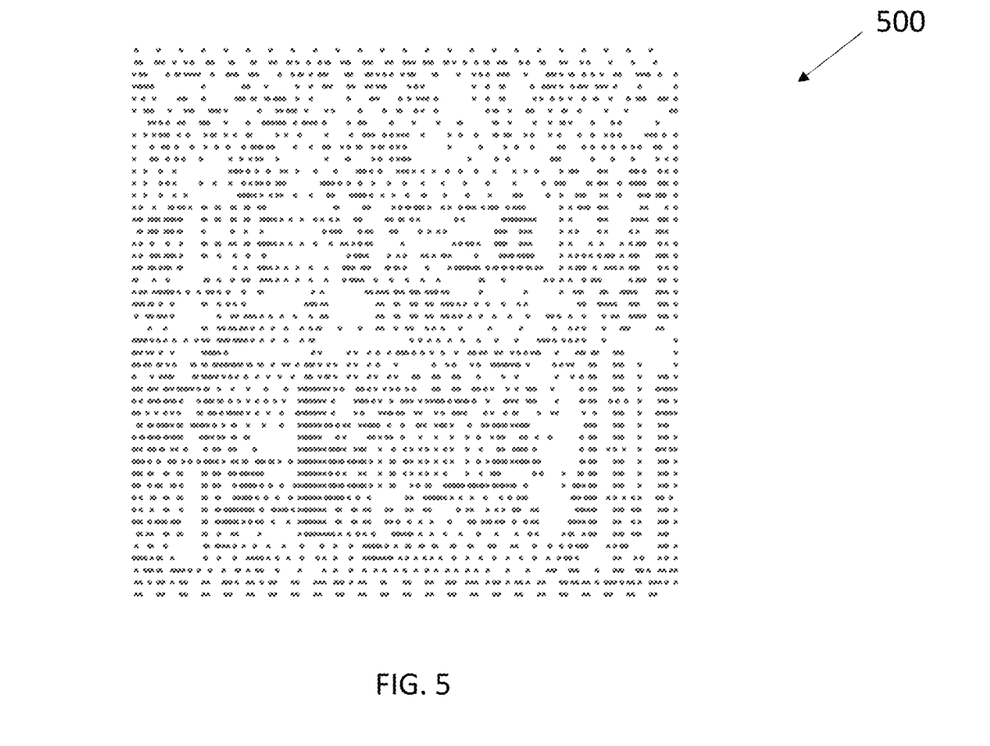
FIG. 5 shows a layout view of a semiconductor die, which is the same product as in FIG. 4, with a converted product pattern, according to an aspect of the present disclosure.

FIG. 4 shows a layout view of a production-version semiconductor die 400 with a conventional product pattern (i.e., Tiger Lake's LTH core design—published), and FIG. 5 shows a layout view of a "converted" semiconductor die 500, i.e., the production-version semiconductor die 400 shown in FIG. 4 that is provided with a new layout, with a collinear product pattern according to an aspect of the present disclosure. The conversion maintained a unit level aspect ratio for both active areas at approximately 24.1 mm×45 mm, a row spacing at approximately 1 um and a spacing between x coordinates was approximately 100 um. The comparison shows the horizontal rows (in the x-direction) were reduced to 47 rows from 3304 rows and an expected takt time improvement of approximately 50×.

Figure 6:
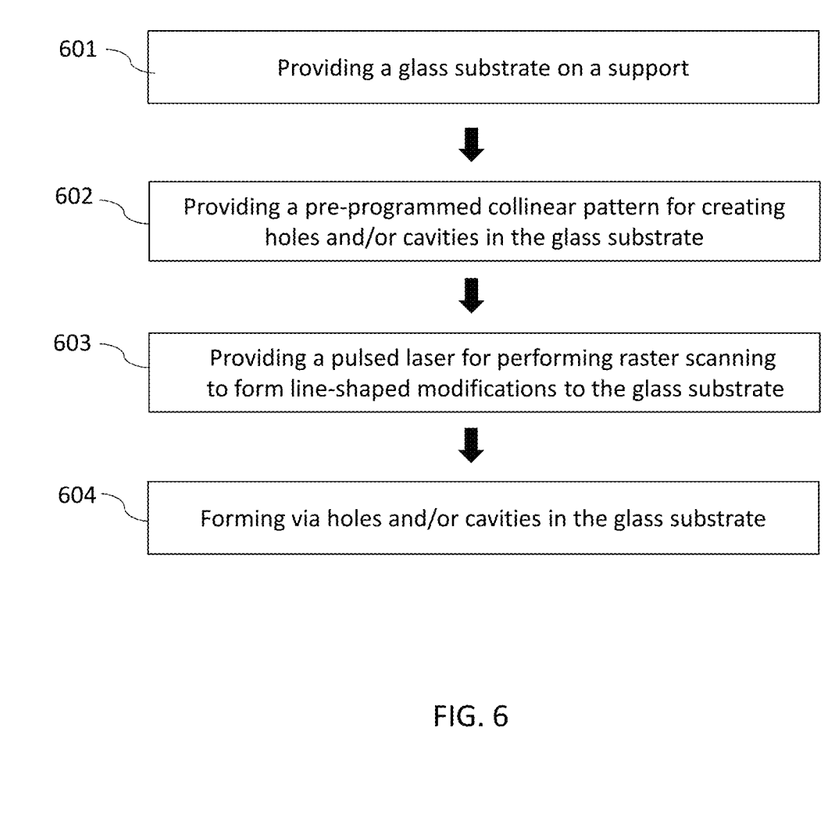
FIG. 6 shows a simplified flow diagram for an exemplary method according to an aspect of the present disclosure.

FIG. 6 shows a simplified flow diagram for an exemplary method according to an aspect of the present disclosure.

The operation 601 may be directed to providing a glass substrate on a support.

The operation 602 may be directed to providing a preprogrammed collinear pattern for creating holes and/or cavities in the glass substrate.

The operation 603 may be directed to providing a pulsed laser for performing raster scanning to form line-shaped modifications to the glass substrate.

The operation 604 may be directed to forming via holes and/or cavities in the glass substrate. The vias and cavities may be formed by a conventional wet etching process.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present metrology system and methods for their use in gap measurements, they will now be described by way of examples. For the sake of brevity, duplicate descriptions of features and properties may be omitted.

EXAMPLES

Example 1 provides an alignment method providing a tool used for forming voids in an object, and a predetermined pattern for movement of the tool, for which the predetermined pattern includes moving the tool in a series of single steps in a first axial direction and in a series of plural lateral steps in a second axial direction that is perpendicular to the first axial direction, for which the single step is followed by the plural lateral steps in a repeating sequence, activating the tool after each of the plural lateral steps, and repeating the single step and plural lateral steps movements of the tool until the predetermined pattern is completed, for which the series of plural lateral steps form an assembly of voids in parallel rows on the object.

Example 2 may include the method of example 1 and/or any other example disclosed herein, for which the tool moves according to the predetermined pattern to form parallel rows that reduce the tool movements and takt time used to form the voids.

Example 3 may include the method of example 1 and/or any other example disclosed herein, further includes a set of design rules for determining the predetermined pattern.

Example 4 may include the method of example 3 and/or any other example disclosed herein, for which the design rules minimize the number of parallel rows for the predetermined pattern.

Example 5 may include the method of example 1 and/or any other example disclosed herein, Example 6 may include the method of example 1 and/or any other example disclosed herein, for which each single step is a movement of a same or variable distance.

Example 7 may include the method of example 1 and/or any other example disclosed herein, for which each of the lateral steps is a movement of a same or variable distance.

Example 8 may include the method of example 1 and/or any other example disclosed herein, for which the tool includes a pulsed laser.

Example 9 may include the method of example 1 and/or any other example disclosed herein, for which the object includes a glass substrate of a semiconductor die.

Example 10 provides a semiconductor die including a substrate with a glass core, and a plurality of vias formed in the glass core, for which the plurality of vias are positioned in a predetermined pattern to form a layout with substantially parallel rows on a top surface of the glass core.

Example 11 may include the semiconductor die of example 10 and/or any other example disclosed herein, for which the plurality of vias further includes through hole vias and/or blind vias in the glass core.

Example 12 may include the semiconductor die of example 10 and/or any other example disclosed herein, for which the glass core further includes a plurality of cavities formed by two or more blind vias.

Example 13 may include the semiconductor die of example 10 and/or any other example disclosed herein, for which the plurality of vias formed in the glass core further includes one or more vias in a first parallel row that are vertically aligned with one or more vias in a second parallel row.

Example 14 may include the semiconductor die of example 10 and/or any other example disclosed herein, further includes a layer of semiconductor devices positioned over the substrate, for which the semiconductor devices are provided in a layout that reduces the signal path to the plurality of vias in the core by maximizing the number of vertical alignments of the semiconductor devices with the plurality of vias.

Example 15 may include the semiconductor die of example 10 and/or any other example disclosed herein, for which the layout of the layer of semiconductor devices follows a set of design rules.

Example 16 provides a method including providing a glass substrate, a pulsed laser tool to produce a line-shaped modification to the glass substrate for forming a plurality of structures in the glass substrate, a predetermined pattern for movement of the pulsed laser tool, for which the predetermined pattern includes moving the pulsed laser tool in a series of single steps in a first axial direction and in a series of plural lateral steps in a second axial direction that is perpendicular to the first axial direction, for which the single step is followed by the plural lateral steps in a repeating sequence, activating the pulsed laser tool after each of the plural lateral steps, and repeating the single step and plural lateral steps movements of the pulsed laser tool until the predetermined pattern is completed, for which the series of plural lateral steps form an assembly of line-shaped modifications in parallel rows on the glass substrate, and forming the plurality of structures from the parallel rows of line-shaped modification in the glass substrate.

Example 17 may include the method of example 16 and/or any other example disclosed herein, for which moving the pulsed laser tool according to the predetermined pattern to form line-shaped modifications in parallel rows on the glass substrate reduces the tool movements and takt time used to form the plurality of structures.

Example 18 may include the method of example 16 and/or any other example disclosed herein, further includes using wet etching to form the plurality of structures.

Example 19 may include the method of example 16 and/or any other example disclosed herein, for which the plurality of structures includes through-hole vias.

Example 20 may include the method of example 16 and/or any other example disclosed herein, for which the line-shaped modifications have a depth that is less than a thickness of the glass substrate and for which the plurality of structures further includes one or more cavities.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An alignment method comprising:
   providing a tool used for forming voids in an object;
   providing a predetermined pattern for movement of the tool, wherein the predetermined pattern comprises moving the tool in a series of single steps in a first axial direction and in a series of plural lateral steps in a second axial direction that is perpendicular to the first axial direction, wherein the single step in the first axial direction is followed by the plural lateral steps in a repeating sequence;
   activating the tool after each of the plural lateral steps; and
   repeating the single step in the first axial direction and plural lateral steps movements of the tool until the predetermined pattern is completed, wherein the series of plural lateral steps form an assembly of voids in parallel rows on the object.

2. The alignment method of claim 1, wherein the tool moves according to the predetermined pattern to form parallel rows of voids.

3. The alignment method of claim 1, further comprises a set of design rules for determining the predetermined pattern for movement of the tool.

4. The alignment method of claim 3, wherein the design rules minimize the number of parallel rows for the predetermined pattern for movement of the tool.

5. The alignment method of claim 1, wherein the movement of the tool further comprises a back and forth motion in the first and second axial directions in a sinusoidal manner.

6. The alignment method of claim 1, wherein each single step in the first axial direction is a movement of a same or variable distance.

7. The alignment method of claim 1, wherein each of the lateral steps is a movement of a same or variable distance.

8. The alignment method of claim 1, wherein the tool comprises a pulsed laser.

9. The alignment method of claim 1, wherein the object comprises a glass substrate of a semiconductor die.

10. A semiconductor die comprising:
    a substrate with a glass core;
    a plurality of vias formed in the glass core, wherein the plurality of vias are positioned in a predetermined pattern to form a layout with substantially parallel rows on a top surface of the glass core,
    wherein the plurality of vias formed in the glass core further comprises one or more vias in a first parallel row that are vertically aligned with one or more vias in a second parallel row.

11. The semiconductor die of claim 10, wherein the plurality of vias further comprises through hole vias and/or blind vias in the glass core.

12. The semiconductor device of claim 10, wherein the glass core further comprises a plurality of cavities formed by two or more blind vias.

13. The semiconductor die of claim 10, further comprising a layer of semiconductor devices positioned over the substrate, wherein the semiconductor devices are provided in a layout that reduces a signal path to the plurality of vias in the core by maximizing a number of vertical alignments of the semiconductor devices with the plurality of vias.

14. The semiconductor die of claim 13, wherein the layout of the layer of semiconductor devices follows a set of design rules that determine the predetermined pattern for movement of a tool.

15. A method comprising:
    providing a glass substrate;
    providing a pulsed laser tool to produce a line-shaped modification to the glass substrate for forming a plurality of structures in the glass substrate;
    providing a predetermined pattern for movement of the pulsed laser tool, wherein the predetermined pattern comprises moving the pulsed laser tool in a series of single steps in a first axial direction and in a series of plural lateral steps in a second axial direction that is perpendicular to the first axial direction, wherein the single step in the first axial direction is followed by the plural lateral steps in a repeating sequence;
    activating the pulsed laser tool after each of the plural lateral steps; and
    repeating the single step in the first axial direction and plural lateral steps movements of the pulsed laser tool until the predetermined pattern is completed, wherein the series of plural lateral steps form an assembly of line-shaped modifications in parallel rows on the glass substrate; and
    forming the plurality of structures from the parallel rows of line-shaped modification in the glass substrate.

16. The method of claim 15, wherein moving the pulsed laser tool according to the predetermined pattern to form line-shaped modifications in parallel rows on the glass substrate reduces the tool movements and takt time used to form the plurality of structures.

17. The method of claim 15, further comprises using wet etching to form the plurality of structures.

18. The method of claim 15, wherein the plurality of structures comprises through-hole vias.

19. The method of claim 15, wherein the line-shaped modifications have a depth that is less than a thickness of the glass substrate and wherein the plurality of structures further comprises one or more cavities.

* * * * *